United States Patent [19]

Baudry

[11] Patent Number: 5,612,677
[45] Date of Patent: Mar. 18, 1997

[54] SYSTEM TO MONITOR THE TEMPERATURE OF AN INTEGRATED CIRCUIT AND TO DISSIPATE HEAT GENERATED THEREBY

[76] Inventor: Jean-Jérôme C. Baudry, 567 Avenue Road, Apartment N102, Toronto, Ontario, Canada, M4V 2K1

[21] Appl. No.: 536,391

[22] Filed: Sep. 29, 1995

[51] Int. Cl.$^6$ .................................................. G08B 21/00
[52] U.S. Cl. ...................... 340/584; 340/521; 340/599; 340/611; 340/653; 364/185
[58] Field of Search .................................. 340/584, 606, 340/611, 599, 595, 653, 521; 364/185

[56] References Cited

U.S. PATENT DOCUMENTS

| | | | |
|---|---|---|---|
| 4,479,115 | 10/1984 | Holzhauer | 340/611 |
| 4,630,036 | 12/1986 | Ford | 340/606 |
| 5,355,123 | 10/1994 | Nishiura et al. | 340/653 |

*Primary Examiner*—Glen Swann
*Attorney, Agent, or Firm*—Fitzpatrick, Cella, Harper & Scinto

[57] ABSTRACT

A system to monitor the temperature of an integrated circuit and to dissipate heat generated thereby includes a heat sink to overlie the integrated circuit. A temperature sensor is located on the heat sink to detect the temperature adjacent the integrated circuit. Temperature signal conditioning circuitry is responsive to the temperature sensor and generates a temperature alarm signal when the temperature at the integrated circuit reaches a threshold level. A fan overlies the heat sink and draws air across and then away from the heat sink to cool it. A pressure transducer is mounted on the fan and detects air flow through the fan. Pressure signal conditioning circuitry is responsive to the pressure transducer and generates a pressure alarm signal when the air flow through the fan falls below a threshold level. Alarms are triggered by the temperature and pressure alarm signals to warn a user.

29 Claims, 6 Drawing Sheets

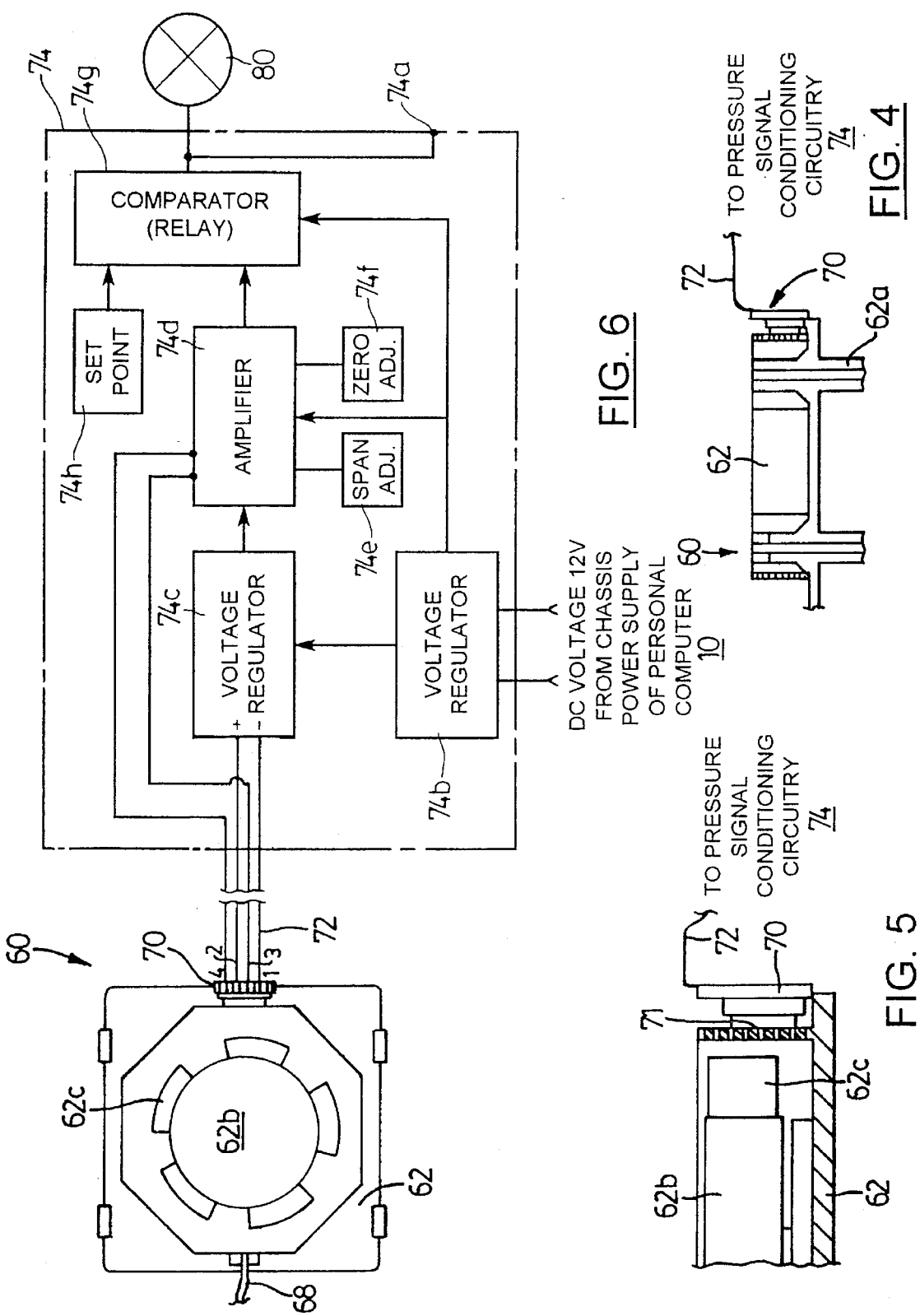

5,612,677

SYSTEM TO MONITOR THE TEMPERATURE OF AN INTEGRATED CIRCUIT AND TO DISSIPATE HEAT GENERATED THEREBY

FIELD OF THE INVENTION

The present invention relates to fail-safes and in particular to a temperature monitor for an integrated circuit, to a heat dissipator for an integrated circuit and to a system to monitor the temperature of an integrated circuit and to dissipate heat generated thereby.

BACKGROUND OF THE INVENTION

Integrated circuits such as microprocessors are well known in the art and are designed to function properly within a predetermined operating temperature range. If the temperature rises above the upper limit of the temperature range, the integrated circuit may malfunction. This is a serious problem especially in financial institutions where computational accuracy is critical.

In the case of personal computers, many include a fan mounted on a wall of the box to circulate air within the box to help dissipate heat generated by the integrated circuits therein. However, problems exist in that in many instances, and particularly in the case of personal computers having very high speed microprocessors, fans of this nature do not adequately dissipate heat generated by the microprocessors. This often results in the temperature within the box, at least adjacent the microprocessor, exceeding the upper operating temperature limit of the microprocessor.

The current trend in the design of microprocessors is to increase processing speed as much possible while minimizing the substrate area of the microprocessor. As substrate area diminishes and the number of components on the substrate increases, generation of heat by the microprocessor becomes greater. This of course compounds the above problem. Accordingly, improved methods to dissipate heat generated by integrated circuits are continually being sought.

It is therefore an object of the present invention to provide a novel temperature monitor for an integrated circuit, a heat dissipator for an integrated circuit and a system to monitor the temperature of an integrated circuit and to dissipate heat generated thereby which obviates or mitigates at least one of the above-mentioned disadvantages.

SUMMARY OF THE INVENTION

According to one aspect of the present invention there is provided a temperature monitor for an integrated circuit comprising:

a heat sink to overlie an integrated circuit to dissipate heat generated thereby;

a temperature sensor on said heat sink to detect the temperature adjacent said integrated circuit; and signal conditioning means responsive to said temperature sensor for generating an alarm signal when the temperature at said integrated circuit reaches a threshold level.

According to another aspect of the present invention there is provided a heat dissipator for an integrated circuit comprising:

a heat sink overlying an integrated circuit;

a fan overlying said heat sink and operable to draw air across and then away from said heat sink to cool the same;

a pressure transducer to detect air flow through said fan; and signal conditioning means responsive to said pressure transducer for generating an alarm signal when the air flow through said fan falls below a threshold level.

According to still yet another aspect of the present invention there is provided a system to monitor the temperature of an integrated circuit and to dissipate heat generated thereby comprising:

a heat sink to overlie an integrated circuit to dissipate heat generated thereby;

a temperature sensor on said heat sink to detect the temperature adjacent said integrated circuit;

temperature signal conditioning means responsive to said temperature sensor for generating a temperature alarm signal when the temperature at said integrated circuit reaches a threshold level;

a fan overlying said heat sink to draw air across and then away from said heat sink to cool the same;

a fan sensor to detect operation of said fan; and fan signal conditioning means responsive to said fan sensor for generating a fan alarm signal when operation of said fan falls below a desired threshold level.

Preferably, the fan sensor is in the form of a pressure transducer mounted on the fan to detect air flow through the fan. In this case, the fan signal conditioning means is in the form of pressure signal conditioning means responsive to the pressure transducer for generating a pressure alarm signal when the air flow through the fan falls below a threshold level. It is also preferred that the system further includes at least one alarm responsive to at least one of the temperature and pressure alarm signals for signifying an alarm condition.

In one embodiment, the temperature signal conditioning means includes an amplifier receiving input from the temperature sensor and a comparator receiving the output of the amplifier and input from a set point circuit. The set point circuit establishes the threshold level and the comparator outputs the temperature alarm signal when the output of the amplifier exceeds the output of the set point circuit.

The pressure signal conditioning means also includes an amplifier receiving input from the pressure transducer and a comparator receiving the output of the amplifier and input from a set point circuit. The set point circuit establishes the threshold level and the comparator outputs the pressure alarm signal when the output of the amplifier falls below the output of the set point circuit.

The above system provides advantages in that air is drawn across and then away from the heat sink by the fan increasing the effectiveness of the heat sink's ability to dissipate heat generated by the integrated circuit. If the fan malfunctions or if the temperature at the integrated circuit reaches a threshold level, an alarm signal is generated which in turn triggers an alarm to warn a user.

BRIEF DESCRIPTION OF THE DRAWINGS

Embodiments of the present invention will now be described more fully with reference to the accompanying drawings in which:

FIG. 4 is a side elevation view of a fan forming part of a heat dissipator;

FIG. 5 is an enlarged, part cross-sectional view of the fan illustrated in FIG. 4;

FIG. 6 is a bottom plan view of the fan illustrated in FIG. 4 and a schematic of pressure signal conditioning circuitry forming part of the heat dissipator;

DESCRIPTION OF THE PREFERRED EMBODIMENTS

Figure 1:
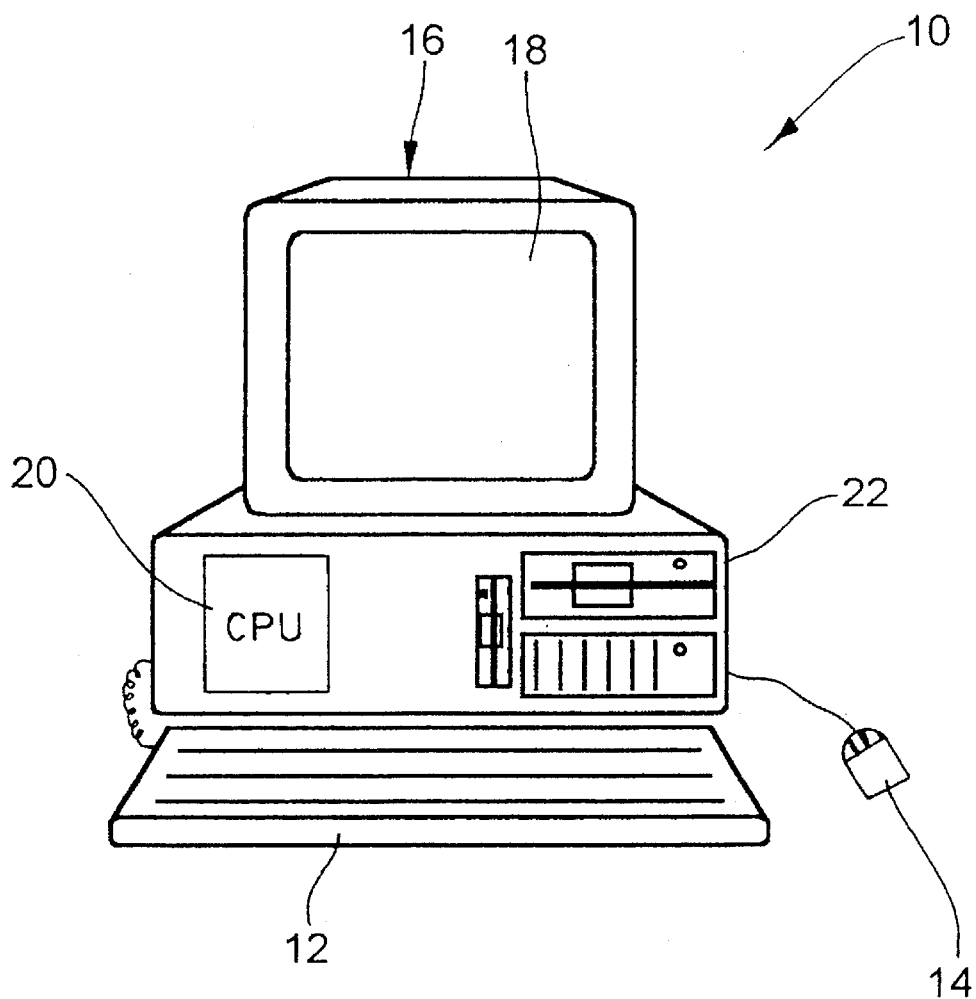
FIG. 1 is a schematic of a personal computer including a boxed processor enclosing a microprocessor.

Referring now to FIG. 1, a personal computer (PC) is shown and is generally indicated by reference numeral 10. Personal computer 10 includes a keyboard 12, a mouse 14 and a monitor 16 having a display screen 18. These components are connected to a central processing unit (CPU) 20 housed within a box 22. The CPU 20 includes a high speed microprocessor 24 (see FIGS. 2 and 3) such as a Pentium® manufactured by Intel Corporation, as well as other components such as memory (not shown). A fan (not shown) may be housed within the box 22 and mounted on a wall thereof to circulate air within the box 22. Since the operation of personal computers of this nature is well known to those of skill in the art, further discussion of the personal computer 10 will not be provided herein.

Figure 2:
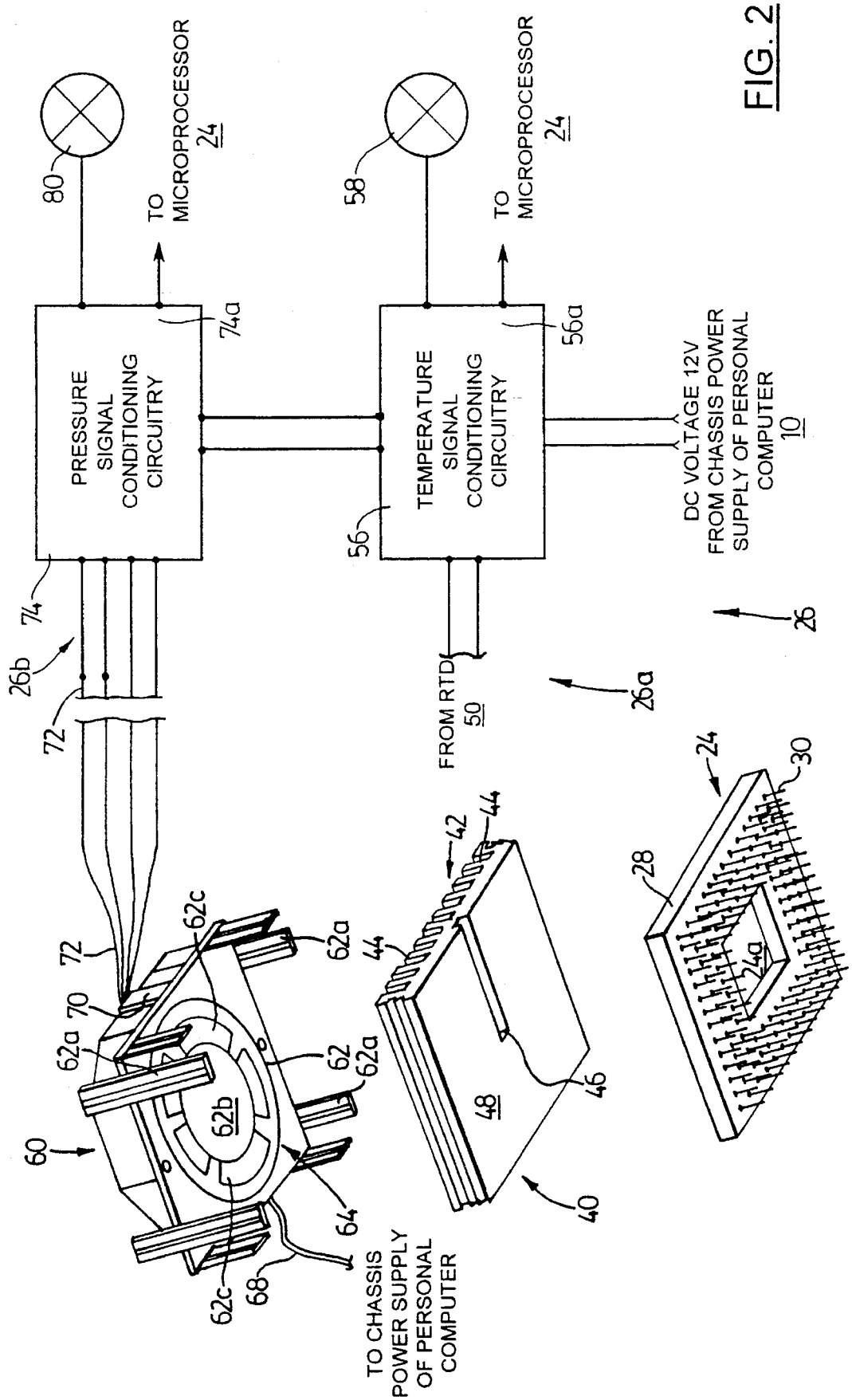
FIG. 2 is a partial exploded perspective view and partial schematic of a system to monitor the temperature of the microprocessor and to dissipate heat generated thereby.
Figure 3:
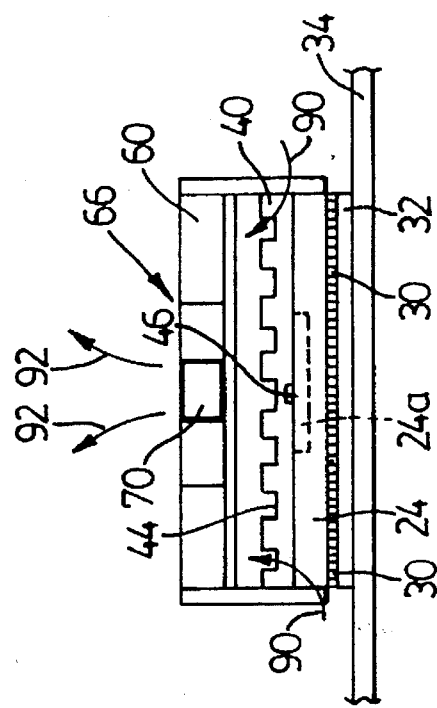
FIG. 3 is a side elevation view of a portion of the system illustrated in FIG. 2.
Figure 9:
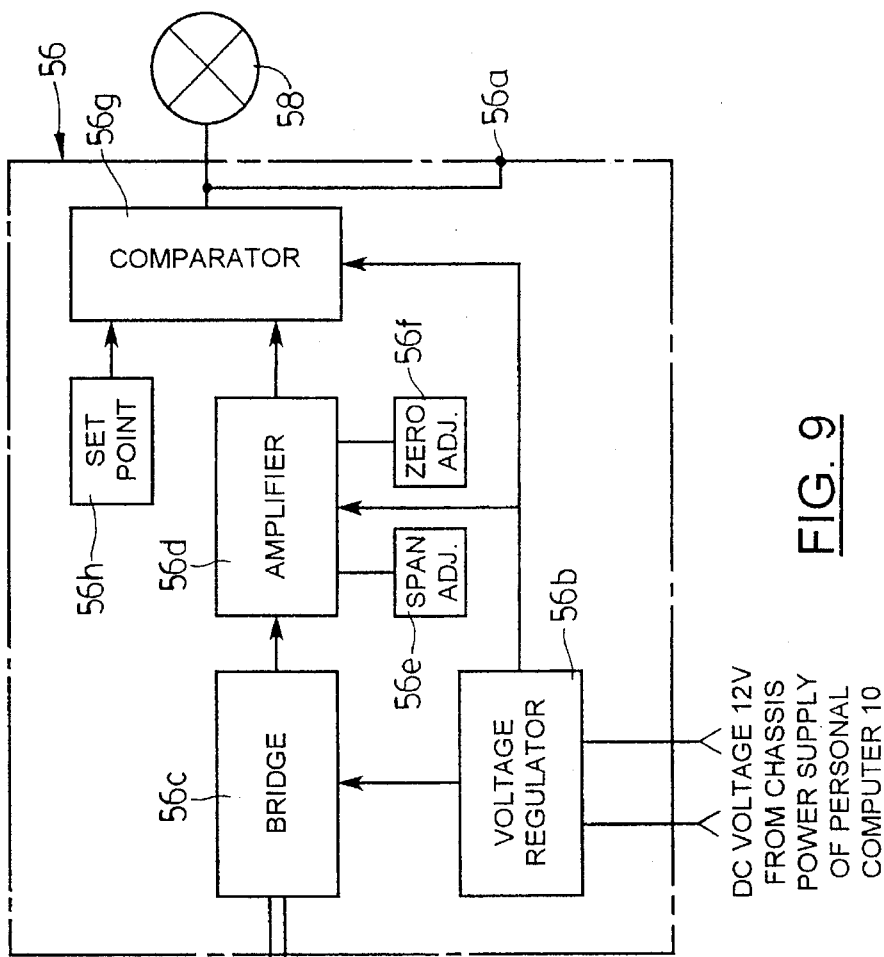
FIG. 9 is a bottom plan view of the heat sink of FIG. 7 and a schematic of temperature signal conditioning circuitry.
Figure 7:
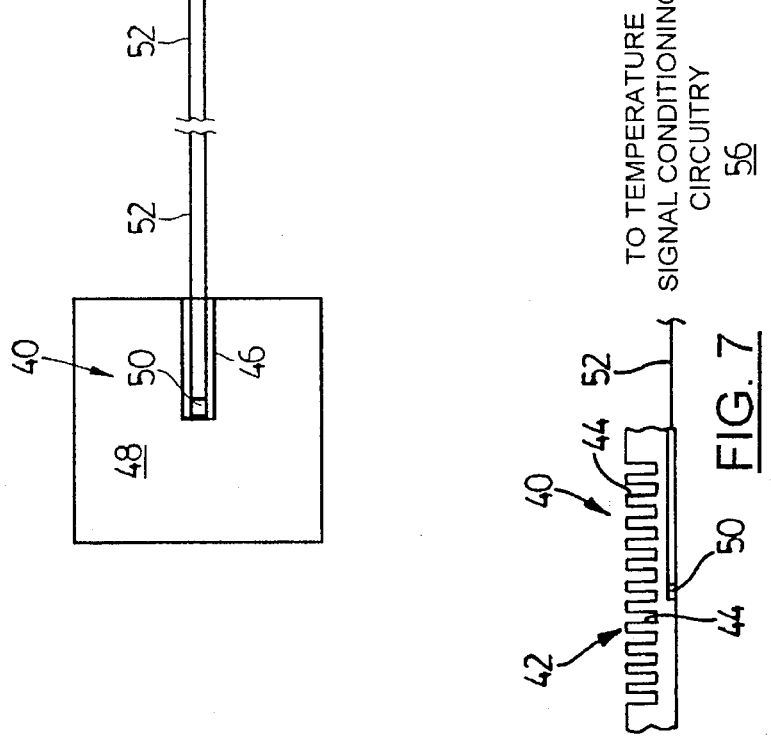
FIG. 7 is a side view of a heat sink.
Figure 8:
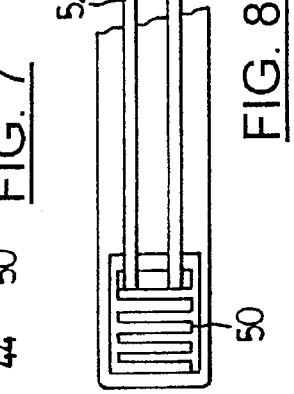
FIG. 8 is an enlarged bottom plan view of the heat sink of FIG. 7 showing a temperature sensor.

Referring now to FIG. 2, a system to monitor the temperature of the microprocessor 24 in the box 22 of personal computer 10 and to dissipate heat generated by the microprocessor is shown and is generally indicated by reference numeral 26. The system 26 includes a temperature monitor 26a for detecting the temperature of the microprocessor 24 and for triggering an alarm when the detected temperature exceeds a threshold value. The system 26 also includes a heat dissipator 26b for dissipating heat generated by the microprocessor 24 and for triggering an alarm when the heat dissipator is not operating in the desired manner. Specifically, system 26 operates to maintain the temperature of the microprocessor 24 below a maximum threshold value and triggers an alarm if the temperature exceeds the threshold value or malfunctions in a manner which is likely to result in the temperature of the microprocessor exceeding the threshold value. Details of the system 26 and its operation will now be described.

In FIG. 2, the microprocessor 24 is shown encased in a plastic or ceramic package 28 from which a plurality of pins 30 project. The pins 30 are received by a connector 32 (see FIG. 3) wired directly to the motherboard 34 within the personal computer 10. The heart 24a of the microprocessor is centrally located within the package 28 and the package 28 is designed to facilitate dissipation of heat generated by the microprocessor 24.

The heat dissipator 26b (see FIGS. 2 to 6) includes a heat sink 40 which overlies and is secured to the microprocessor 24. The heat sink 40 is formed of aluminum and has a ribbed surface 42 defining a plurality of generally parallel channels 44. The ribbed surface 42 increases the surface area of the heat sink thereby increasing its ability to draw heat from the microprocessor 24.

Overlying the ribbed surface 42 of the heat sink 40 is a fan 60. The fan 60 includes a housing 62 from which a plurality of legs 62a depend. The legs 62a surround the heat sink 40 and are attached to it securing the fan 60 to the heat sink. Within the housing 62 is a rotor 62b having a plurality of fan blades 62c about its periphery. The fan blades 62c are oriented and rotated in a manner so that the intake port 64 of the fan 60 is located directly over the heat sink 40 and so that the fan exhaust port 66 is remote from the heat sink. When the fan 60 is operating, air is drawn across and then away from the heat sink 40 helping to cool the heat sink by creating air flow along the channels 44. This in turn allows the heat sink to remove more heat generated by the microprocessor 24.

Electrical leads 68 extend from the fan 60 and are connected to the chassis power supply of the personal computer 10. A CPC silicon pressure transducer 70 such as that manufactured by Data Instruments of Acton, Mass. is mounted on the housing 62 and communicates with the interior of the housing via an aperture 71 formed through a wall of the housing. The pressure transducer 70 detects the pressure within the housing 62 as air flows through it between the intake and exhaust ports 64 and 66 respectively. Electrical leads 72 extend from the pressure transducer 70 and lead to pressure signal conditioning circuitry 74.

The pressure signal conditioning circuitry 74 receives the output of the pressure transducer and supplies output alarm signals to an alarm 80. The alarm 80 may be in the form of an audio and/or visual indicator such as a buzzer, speaker and/or LED and signifies an alarm condition in response to input received from the pressure signal conditioning circuitry 74. The pressure signal conditioning circuitry 74 also includes an output port 74a to allow its output to be supplied to the motherboard 34.

The pressure signal conditioning circuitry 74 includes a voltage regulator 74b connected to the chassis power supply of the personal computer 10. The voltage regulator 72b supplies power to a second voltage regulator 72c which in turn supplies excitation power to the pressure transducer 70. The output electrical leads 72 of the pressure transducer 70 are connected to an amplifier 74d. Amplifier 74d receives power from the voltage regulator 72b and also receives input from zero adjust and span adjust circuits 74e and 74f respectively. The output of amplifier 74d is applied to a comparator 74g which also receives input from a set point circuit 74h. The set point circuit 74h is adjustable and determines the minimum operating level of the fan 60. The output of the comparator 74g is applied to the alarm 80 as well as to the output port 74a.

The temperature monitor 26a (see FIGS. 2 and 7 to 9) includes a thin film platinum resistive temperature detector (RTD) 50 such as that manufactured by HY-CAL Engineering (A Unit of General Signal). The RTD 50 is accommodated in recess 46 formed in the surface 48 of the heat sink 40 which overlies the microprocessor 24. The recess 46 is configured to position the RTD 50 so that it overlies and is as close as possible to the heart 24a of the microprocessor 24. Electrical leads 52 extend from the RTD 50 and run to temperature signal conditioning circuitry 56. The temperature signal conditioning circuitry 56 receives the output of the RTD 50 and supplies output alarm signals to an alarm 58. The alarm 58 may also be in the form of an audio and/or visual indicator such as a buzzer, speaker and/or LED and signifies an alarm condition in response to input received from the temperature signal conditioning circuitry 56. The temperature signal conditioning circuitry 56 also includes an output port 56a to allow its output to be supplied to the motherboard 34.

The temperature signal conditioning circuitry 56 includes a voltage regulator 56b connected to the chassis power supply of the personal computer 10. The voltage regulator 56b supplies power to a bridge 56c which receives the electrical leads 52 extending from the RTD 50. The output of the bridge 56c is applied to an amplifier 56d which receives power from the voltage regulator 56b. The amplifier 56d also receives input from zero adjust and span adjust circuits 56e and 56f respectively and provides output to a comparator 56g. The comparator 56g also receives input from an adjustable set point circuit 56h and supplies output to the alarm 58 as well as to the output port 56a. The set point circuit 74h is typically set so that the threshold level is slightly below the upper limit of the operating temperature range of the microprocessor 24.

The operation of the system 26 will now be described. During assembly of the personal computer 10, and after the microprocessor 24 has been connected to the motherboard 34, the heat sink 40 and fan 60 are secured to one another and are attached to the microprocessor 24. The RTD 50 and pressure transducer 70 are then connected to the temperature and pressure signal conditioning circuitry 56 and 74 respectively. With the temperature and pressure signal conditioning circuitry 56 and 74 connected to the chassis power supply of the personal computer 10 and to the alarms 58 and 80, when the personal computer 10 is powered up, power is supplied to the fan 60 via electrical leads 68 to drive the rotor 62b and fan blades 62c.

While the personal computer 10 is powered, the microprocessor 24 generates heat which is dissipated through the package 28. The heat sink 40 removes the heat from the microprocessor. As the fan blades 62c are rotated, air is drawn by the fan 60 across and through the channels 44 of the heat sink 40 to cool it. The air is then drawn away from the heat sink 40 through the housing 62 where it is discharged via the fan exhaust port 66 (see arrows 90 and 92 in FIG. 3). This improves the ability of the heat sink 40 to draw heat from the microprocessor 24 keeping the temperature of the microprocessor below the upper limit of its desired operating temperature range.

The RTD 50 generates output signals having a magnitude representative of the temperature adjacent the microprocessor 24. The bridge 56c receives the output signals of the RTD 50 and supplies output signals to the amplifier 56d. The amplifier 56d amplifies the input signals to appropriate levels as determined by the span and zero adjust circuits 56e and 56f respectively, and applies the amplified signals to the comparator 56g. The comparator 56g compares the output of the amplifier 56d with the output of the set point circuit 56h and when the amplifier output exceeds the output of the set point circuit 56h, the comparator 56g generates an alarm signal which triggers the alarm 58. When the alarm 58 is triggered, a user of the personal computer 10 will know that the temperature at the microprocessor 24 is approaching the upper limit of its operating temperature range and will know to turn the personal computer 10 off to allow the microprocessor 24 to cool down.

Likewise, the pressure transducer 70 generates output signals representative of the detected pressure of air flow through the fan 60. The amplifier 74d receives the output signals of the pressure transducer 70 amplifies the input signals to appropriate levels as determined by the span and zero adjust circuits 74e and 74f respectively. The amplified signals in turn are applied to the comparator 74g. The comparator 74g compares the output of the amplifier 74d with the output of the set point circuit 74h and when the amplifier 74d output falls below the output of the set point circuit 74h, the comparator 74g generates an alarm signal which triggers the alarm 80. When the alarm 80 is triggered, a user will know that the fan 60 has stopped or is rotating at a speed which is insufficient to cool the heat sink 40 to the point where the microprocessor 24 is not likely to overheat.

When the ports 56a and 74a of the temperature and pressure conditioning circuitry 56 and 74 respectively are connected to the motherboard 34, the motherboard 34 can use the output of the comparators 56g and 74g to display the temperature and pressure conditions on the screen 18 of monitor 16.

Alternatively, the temperature and pressure conditioning circuitry 56 and 74 respectively may be connected to or incorporated on a data acquisition ISA, MCA, EISA, or PCI adapter card designed to be accommodated by one of the expansion slots on the motherboard 34. In this case, the data acquisition card will include appropriate software to allow historical records of the pressure and temperature signal conditioning circuitry output to be kept. Also, the data acquisition card may use the output of the amplifiers 56d and 74d respectively to allow the temperature of the microprocessor 24 and the pressure at the fan 60 to be displayed continuously on the screen 18 of the monitor 16 in any desired format.

Although not shown, the pressure and temperature signal conditioning circuitry are mounted on a common board. The board may be located within the interior of the box 22 at any convenient location. Likewise, the alarms 58 and 80 may be located on the personal computer 10 at any desired location. In the case of audio alarms, the alarms 58 and 80 may be located within the box while in the case of visual indicators, the alarms may be mounted on the outside of the box at any desired location.

Figure 10:
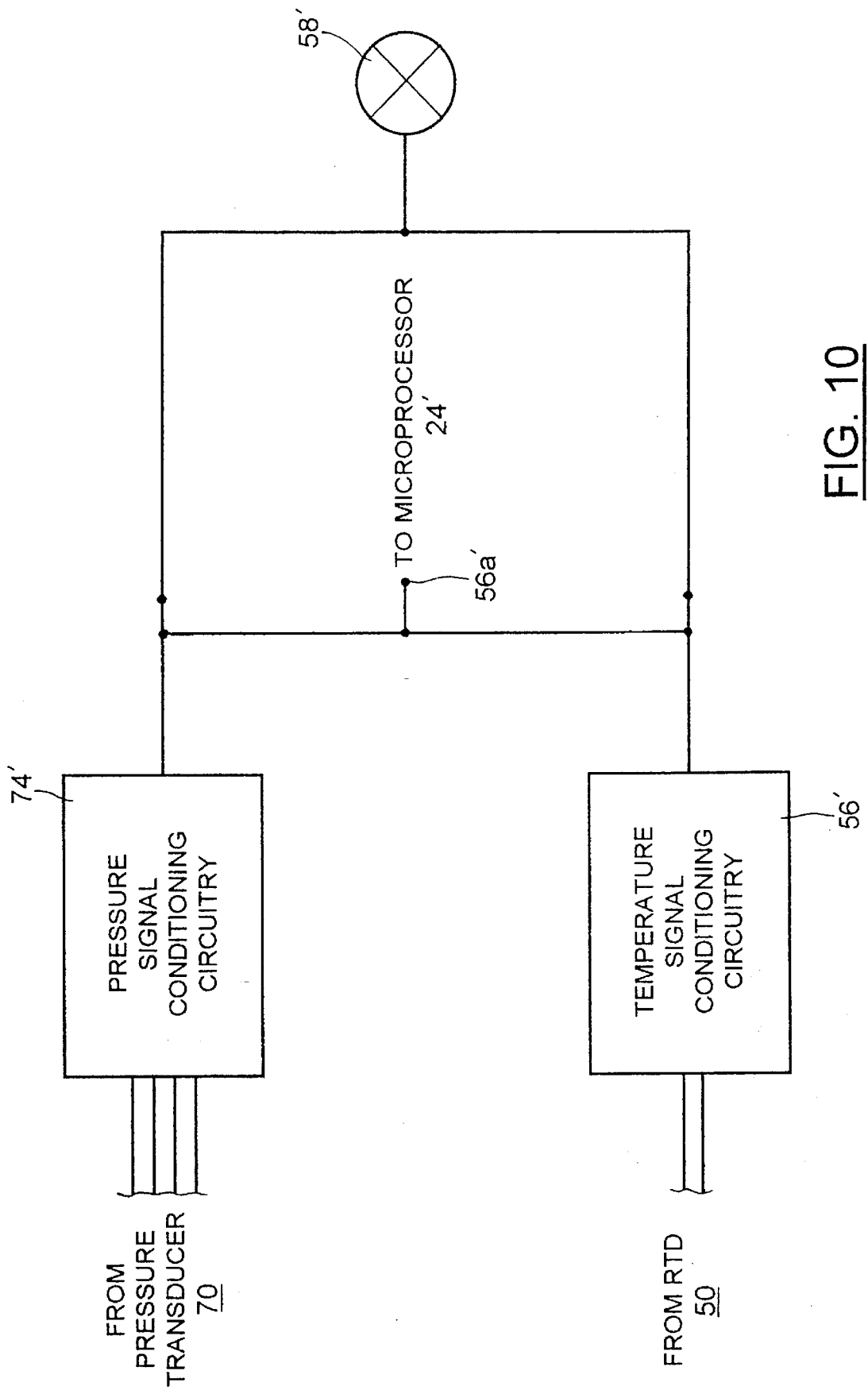
FIG. 10 is an alternative embodiment of pressure and temperature signal conditioning circuitry for a system to monitor the temperature of an integrated circuit and to dissipate heat generated thereby.

Although, the pressure and temperature signal conditioning circuitry have been described as supplying alarm signals to separate alarms, it should be apparent to those of skill in the art that a single alarm may be used. FIG. 10 shows an embodiment of system 26 where the outputs of the pressure and temperature signal conditioning circuitry 74' and 56' respectively are coupled and lead to a single alarm 58' so that if one or both of the pressure and temperature signal conditioning circuitry generate an alarm signal, the alarm 58' is triggered. The pressure and temperature signal conditioning circuitry also supply output to a common output port 56a'.

Also, although the pressure and temperature signal conditioning circuitry have been described as being mounted on a board, it is contemplated that the pressure and temperature signal conditioning circuitry be located directly on the motherboard 34 during assembly of the personal computer 10.

Figure 11:
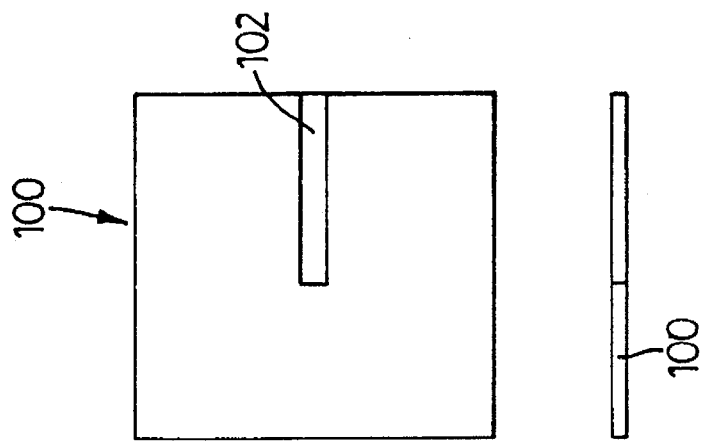
FIG. 11 are bottom plan and side elevation views respectively of a thin plate for retrofitting a temperature sensor to a heat sink.

Although the embodiment illustrated in FIGS. 1 to 9 shows the RTD 50 accommodated in a recess 46 formed in the surface 48 of the heat sink 40, if a conventional prefabricated heat sink is to be used, the RTD 50 may be retrofitted to the heat sink. Referring now to FIG. 11, a thin plate 100 formed of heat conductive material such as aluminum is shown. The plate 100 has a cut-out 102 formed in it which is basically of the same dimension as recess 46. When the RTD 50 is to be retrofitted to a conventional heat sink, the plate 100 is secured to the surface 48 of the heat sink which overlies the microprocessor 24. The RTD 50 is then accommodated in the cut-out 102 and is attached to the surface 48 of the heat sink. The heat sink with the plate and RTD attached can then be secured to the microprocessor 24.

Although the temperature sensor 50 has been described as being in the form of an RTD, it should be apparent to those of skill in the art that other types of temperature sensors may be used such as for example a thermo-couple. Likewise, other types of sensors may be used to detect proper operation of the fan 60 such as a rotation sensor although the pressure transducer 70 is preferred.

The present invention has been described with reference to the removal of heat generated by a microprocessor in a personal computer. Those of skill in the art will however, appreciate that the present invention can be used in many environments where it is necessary to cool an integrated circuit to inhibit the surrounding temperature from exceeding the upper limit of the integrated circuit's operating temperature range.

As those of skill in the art will appreciate other modifications and variations may be made to the present invention without departing from its scope as defined by the appended claims.

I claim:

1. A temperature monitor for an integrated circuit comprising:
   a heat sink to overlie an integrated circuit to dissipate heat generated thereby;
   a temperature sensor on said heat sink to detect the temperature adjacent said integrated circuit; and
   signal conditioning means responsive to said temperature sensor for generating an alarm signal when the temperature at said integrated circuit reaches a threshold level.

2. A temperature monitor as defined in claim 1 further comprising an alarm responsive to said alarm signal for signifying an alarm condition.

3. A temperature monitor as defined in claim 2 wherein said alarm is in the form of an audio and/or visual indicator.

4. A temperature monitor as defined in claim 2 wherein said temperature sensor is accommodated in a recess formed in a surface of said heat sink, said surface overlying said integrated circuit.

5. A temperature monitor as defined in claim 2 further comprising a heat conductive plate attached to a surface of said heat sink, said surface overlying said integrated circuit, said plate having a cut-out therein, said temperature sensor being accommodated in said cut-out and being attached to said surface.

6. A temperature monitor as defined in claim 2 wherein said signal conditioning means includes an amplifier receiving input from said temperature sensor and a comparator receiving the output of said amplifier and input from a set point circuit, said set point circuit establishing said threshold level, said comparator outputting said alarm signal when the output of said amplifier exceeds the output of said set point circuit.

7. A temperature monitor as defined in claim 6 wherein said set point circuit is adjustable.

8. A temperature monitor as defined in claim 7 wherein said temperature sensor is in the form of a resistive temperature detector or a thermo-couple.

9. A temperature monitor as defined in claim 1 wherein said threshold level is adjustable.

10. A heat dissipator for an integrated circuit comprising:
    a heat sink overlying an integrated circuit;
    a fan overlying said heat sink and operable to draw air across and then away from said heat sink to cool the same;
    a pressure transducer to detect air flow through said fan; and
    signal conditioning means responsive to said pressure transducer for generating an alarm signal when the air flow through said fan falls below a threshold level.

11. A heat dissipator as defined in claim 10 further comprising an alarm responsive to said alarm signal for signifying an alarm condition.

12. A heat dissipator as defined in claim 11 wherein said alarm is in the form of an audio and/or visual indicator.

13. A heat dissipator as defined in claim 11 wherein said fan includes a housing having an aperture formed therethrough, said pressure transducer being mounted on said housing at said aperture and detecting air flow through said fan via said aperture.

14. A heat dissipator as defined in claim 11 wherein said signal conditioning means includes an amplifier receiving input from said pressure transducer and a comparator receiving the output of said amplifier and input from a set point circuit, said set point circuit establishing said threshold level, said comparator outputting said alarm signal when the output of said amplifier falls below the output of said set point circuit.

15. A heat dissipator as defined in claim 14 wherein said set point circuit is adjustable.

16. A heat dissipator as defined in claim 10 wherein said threshold level is adjustable.

17. A system to monitor the temperature of an integrated circuit and to dissipate heat generated thereby comprising:
    a heat sink to overlie an integrated circuit to dissipate heat generated thereby;
    a temperature sensor on said heat sink to detect the temperature adjacent said integrated circuit;
    temperature signal conditioning means responsive to said temperature sensor for generating a temperature alarm signal when the temperature at said integrated circuit reaches a threshold level;
    a fan overlying said heat sink to draw air across and then away from said heat sink to cool the same;
    a fan sensor to detect operation of said fan; and
    fan signal conditioning means responsive to said fan sensor for generating a fan alarm signal when the operation of said fan falls below a desired threshold level.

18. A system as defined in claim 17 wherein said fan sensor is in the form of a pressure transducer mounted on said fan to detect air flow through said fan and wherein said fan signal conditioning means is in the form of pressure signal conditioning means responsive to said pressure transducer for generating a pressure alarm signal when the air flow through said fan falls below a threshold level.

19. A system as defined in claim 18 further comprising at least one alarm responsive to at least one of said temperature and pressure alarm signals for signifying an alarm condition.

20. A system as defined in claim 19 wherein said at least one alarm is responsive to both of said temperature and pressure alarm signals.

21. A system as defined in claim 20 further comprising an alarm associated each of said temperature and pressure signal conditioning means.

22. A system as defined in claim 21 wherein said alarms are in the form of an audio and/or visual indicator.

23. A system as defined in claim 22 wherein said temperature sensor is accommodated in a recess formed in a surface of said heat sink, said surface overlying said integrated circuit.

24. A system as defined in claim 22 further comprising a heat conductive plate attached to a surface of said heat sink, said surface overlying said integrated circuit, said plate having a cut-out therein, said temperature sensor being accommodated in said cut-out and being attached to said surface.

25. A system as defined in claim 20 wherein said temperature signal conditioning means includes an amplifier receiving input from said temperature sensor and a comparator receiving the output of said amplifier and input from a set point circuit, said set point circuit establishing said threshold level, said comparator outputting said temperature alarm signal when the output of said amplifier falls below the output of said set point circuit.

26. A system as defined in claim 25 wherein said set point circuit is adjustable.

27. A system as defined in claim 20 wherein said fan includes a housing having an aperture formed therethrough, said pressure transducer being mounted on said housing at said aperture and detecting air flow through said fan via said aperture.

28. A system as defined in claim 27 wherein said pressure signal conditioning means includes an amplifier receiving input from said pressure transducer and a comparator receiving the output of said amplifier and input from a set point circuit, said set point circuit establishing said threshold level, said comparator outputting said pressure alarm signal when the output of said amplifier falls below the output of said set point circuit.

29. A system as defined in claim 28 wherein said set point circuit is adjustable.

* * * * *